(12) United States Patent
Kuroyanagi et al.

(10) Patent No.: US 10,692,791 B2
(45) Date of Patent: Jun. 23, 2020

(54) ELECTRONIC COMPONENT PACKAGE WITH ELECTROMAGNETIC WAVE SHIELDING

(71) Applicant: SAMSUNG ELECTRONICS CO., LTD., Suwon-si (KR)

(72) Inventors: Akihisa Kuroyanagi, Suwon-Si (KR); Jun Woo Myung, Suwon-Si (KR); Jae Kul Lee, Suwon-Si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/178,224

(22) Filed: Nov. 1, 2018

(65) Prior Publication Data

US 2019/0371692 A1 Dec. 5, 2019

(30) Foreign Application Priority Data

Jun. 4, 2018 (KR) ........................ 10-2018-0064262

(51) Int. Cl.
*H01L 23/31* (2006.01)
*H01L 23/00* (2006.01)
*H01L 23/538* (2006.01)

(52) U.S. Cl.
CPC ...... *H01L 23/3114* (2013.01); *H01L 23/3178* (2013.01); *H01L 23/5385* (2013.01); *H01L 24/26* (2013.01)

(58) Field of Classification Search
CPC . H01L 23/3114; H01L 23/3178; H01L 24/26; H01L 23/5385; H01L 23/31; H01L 23/00; H01L 23/538

(Continued)

(56) References Cited

U.S. PATENT DOCUMENTS 9,508,683 B1   11/2016 Choi
9,875,970 B2 *  1/2018 Yi ...................... H01L 23/5389
(Continued)

FOREIGN PATENT DOCUMENTS

JP       2008-130915 A   6/2008
KR   10-2017-0079381 A   7/2017
(Continued)

OTHER PUBLICATIONS

Office Action, issued in corresponding Taiwanese Patent Application No. 107138110, dated Apr. 30, 2019.
(Continued)

*Primary Examiner* — Alexander O Williams
(74) *Attorney, Agent, or Firm* — Sughrue Mion, PLLC

(57) ABSTRACT

An electronic component package includes a core member including an insulating layer, and having a first through-hole passing through the insulating layer, a semiconductor chip disposed in the first through-hole, and having an active surface on which a connection pad is disposed, and an inactive surface opposing the active surface, an encapsulant encapsulating the core member and the semiconductor chip, and filling at least a portion of the first through-hole, a connection member disposed on the core member and the semiconductor chip, and including a redistribution layer electrically connected to the connection pad, a backside metal layer disposed on the encapsulant, and covering at least the inactive surface of the semiconductor chip, and a backside metal via passing through the encapsulant, and connecting the backside metal layer to one side of the insulating layer. The backside metal via is in contact with the one side of the insulating layer.

20 Claims, 13 Drawing Sheets

(58) Field of Classification Search
USPC .......................................... 257/737, 738, 778
See application file for complete search history.

(56) References Cited

U.S. PATENT DOCUMENTS

| | | |
|---|---|---|
| 2017/0278812 A1 | 9/2017 | Lee et al. |
| 2017/0287825 A1 | 10/2017 | Lee et al. |
| 2017/0309571 A1 | 10/2017 | Yi et al. |
| 2018/0053732 A1 | 2/2018 | Baek et al. |
| 2018/0138029 A1 | 5/2018 | Kim et al. |

FOREIGN PATENT DOCUMENTS

| | | |
|---|---|---|
| KR | 10-2017-0112363 A | 10/2017 |
| KR | 10-2017-0121666 A | 11/2017 |

OTHER PUBLICATIONS

Communication dated Jul. 1, 2019, issued by the Korean Intellectual Property Office in counterpart Korean Patent Application No. 10-2018-0064262.

* cited by examiner

II–II'

ELECTRONIC COMPONENT PACKAGE WITH ELECTROMAGNETIC WAVE SHIELDING

CROSS-REFERENCE TO ASSOCIATED APPLICATION

This application claims the benefit of priority to Korean Patent Application No. 10-2018-0064262, filed on Jun. 4, 2018 with the Korean Intellectual Property Office, the entirety of which is incorporated herein by reference.

BACKGROUND

The present disclosure relates to an electronic component package for packaging a semiconductor chip and/or a passive component to be redistributed.

As mobile devices have become more prominent, smartphones central thereamong, a new mobile era has been created that has not been seen in the past. Here, both small and large problems are occurring. Among such problems, a particularly common problem is malfunctioning of a device due to electromagnetic interference. As a result, interest in the electromagnetic wave shielding technology is increasing.

For user grip and design, thinner but more advanced devices are required, so a semiconductor, a necessary component, becomes smaller and thinner. As electromagnetic waves, generated by the components located without a clearance space, interfere with each other, malfunctioning has been caused. To solve the problem of malfunction described above, in the IT industry, electromagnetic interference (EMI) shielding technology is being actively applied.

SUMMARY

An aspect of the present disclosure provides an electronic component package capable of effectively shielding electromagnetic waves and improving reliability of a shielding structure.

According to an aspect of the present disclosure, a backside metal layer for electromagnetic shielding is provided on an encapsulant for sealing a semiconductor chip and/or a passive component, and the backside metal layer is connected to a core member having a through-hole accommodating a semiconductor chip and/or a passive component using a backside metal via passing through an encapsulant, and is allowed to be in contact with an insulating layer, rather than a metal layer of the core member.

According to an aspect of the present disclosure, an electronic component package includes: a core member including an insulating layer, and having a first through-hole passing through the insulating layer; a semiconductor chip disposed in the first through-hole, and having an active surface on which a connection pad is disposed, and an inactive surface opposing the active surface; an encapsulant covering at least a portion of each of the core member and the inactive surface of the semiconductor chip, and filling at least a portion of the first through-hole; a connection member disposed on the core member and the active surface of the semiconductor chip, and including a redistribution layer electrically connected to the connection pad; a backside metal layer disposed on the encapsulant, and covering at least the inactive surface of the semiconductor chip; and a backside metal via passing through the encapsulant, and connecting the backside metal layer to one side of the insulating layer. The backside metal via is in contact with the one side of the insulating layer.

According to an aspect of the present disclosure, an electronic component package includes: a core member including an insulating layer having a through-hole, and a metal layer disposed on an upper surface of the insulating layer and having a groove portion exposing a portion of the upper surface of the insulating layer; an electronic component disposed in the through-hole; an encapsulant encapsulating each of the core member and the electronic component, and filling at least a portion of each of the groove portion and the through-hole; a connection member disposed below the core member and the electronic component, and including a redistribution layer electrically connected to the electronic component; a backside metal layer disposed on an upper surface of the encapsulant, and covering the electronic component; and a backside metal via passing through the encapsulant, and connecting the backside metal layer to the upper surface of the insulating layer, exposed through the groove portion.

According to an aspect of the present disclosure, an electronic component package includes: a core member including an insulating layer, and having a through-hole passing through the insulating layer; a semiconductor chip disposed in the through-hole, and having an active surface on which a connection pad is disposed and an inactive surface opposing the active surface; an encapsulant covering at least a portion of each of the core member and the inactive surface of the semiconductor chip, and filling at least a portion of the through-hole; a connection member disposed on the core member and the active surface of the semiconductor chip, and including a redistribution layer electrically connected to the connection pad; a backside metal layer disposed on the encapsulant, and covering at least the inactive surface of the semiconductor chip; and a backside metal via passing through the encapsulant, and connecting the backside metal layer to the insulating layer. The core member further includes a metal layer disposed on the insulating layer. The metal layer has a groove portion exposing a portion of the insulating layer. The backside metal via passes through the groove portion of the metal layer, is in contact with the insulating layer, and is spaced apart from the metal layer by the encapsulant filling the groove portion.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Figure 1:
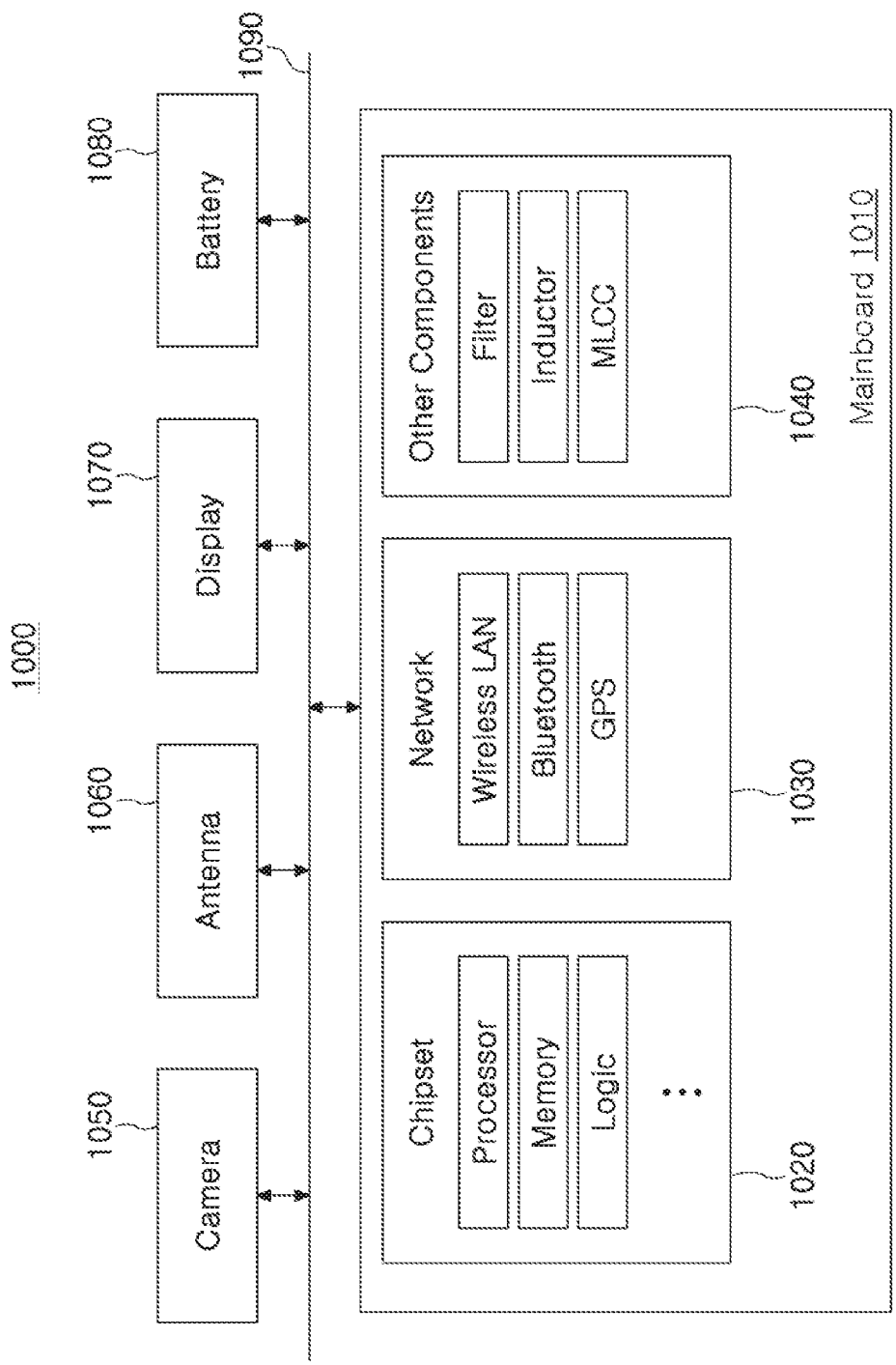
FIG. 1 is a block diagram schematically illustrating an example of an electronic device system.

Hereinafter, embodiments of the present disclosure will be described as follows with reference to the attached drawings.

The present disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

Throughout the specification, it will be understood that when an element, such as a layer, region or wafer (substrate), is referred to as being 'on,' 'connected to,' or 'coupled to' another element, it can be directly 'on,' 'connected to,' or 'coupled to' the other element or other elements intervening therebetween may be present. In contrast, when an element is referred to as being 'directly on,' 'directly connected to,' or 'directly coupled to' another element, there may be no other elements or layers intervening therebetween. Like numerals refer to like elements throughout. As used herein, the term 'and/or' includes any and all combinations of one or more of the associated listed items.

It will be apparent that although the terms first, second, third, etc. may be used herein to describe various members, components, regions, layers and/or sections, any such members, components, regions, layers and/or sections should not be limited by these terms. These terms are only used to distinguish one member, component, region, layer or section from another region, layer or section. Thus, a first member, component, region, layer or section discussed below could be termed a second member, component, region, layer or section without departing from the teachings of the exemplary embodiments.

Spatially relative terms, such as 'above,' 'upper,' 'below,' and 'lower' and the like, may be used herein for ease of description to describe one element's relationship relative to another element(s) as shown in the figures. It will be understood that spatially relative terms are intended to encompass different orientations of the device in use or operation, in addition to the orientation depicted in the figures. For example, if the device in the figures is turned over, elements described as 'above,' or 'upper' relative to other elements would then be oriented 'below,' or 'lower' relative to the other elements or features. Thus, the term 'above' can encompass both the above and below orientations depending on a particular direction of the figures. The device may be otherwise oriented (rotated 90 degrees or at other orientations) and the spatially relative descriptors used herein may be interpreted accordingly.

The terminology used herein describes particular embodiments only, and the present disclosure is not limited thereby. As used herein, the singular forms 'a,' 'an,' and 'the' are intended to include the plural forms as well, unless the context clearly indicates otherwise. It will be further understood that the terms 'comprises,' and/or 'comprising' when used in this specification, specify the presence of stated features, integers, steps, operations, members, elements, and/or groups thereof, but do not preclude the presence or addition of one or more other features, integers, steps, operations, members, elements, and/or groups thereof.

Hereinafter, embodiments of the present disclosure will be described with reference to schematic views illustrating embodiments of the present disclosure. In the drawings, for example, due to manufacturing techniques and/or tolerances, modifications of the shape shown may be estimated. Thus, embodiments of the present disclosure should not be construed as being limited to the particular shapes of regions shown herein, for example, to include a change in shape results in manufacturing. The following embodiments may also be constituted alone, in combination or in partial combination.

The contents of the present disclosure described below may have a variety of configurations and propose only a required configuration herein, but are not limited thereto.

Electronic Device

FIG. 1 is a schematic block diagram illustrating an example of an electronic device system.

Referring to FIG. 1, an electronic device 1000 may receive a motherboard 1010. The mainboard 1010 may include chip associated components 1020, network associated components 1030, other components 1040, or the like, physically or electrically connected thereto. These components may be connected to others to be described below to form various signal lines 1090.

The chip associated components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital converter, an application-specific integrated circuit (ASIC), or the like, or the like. However, the chip associated components 1020 are not limited thereto, and may include other types of chip associated components. In addition, the chip-associated components 1020 may be combined with each other.

The network associated components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+(HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth®, 3G, 4G, and 5G protocols, and any other wireless and wired protocols, designated after the abovementioned protocols. However, the network associated components 1030 are not limited thereto, but may also include a variety of other wireless or wired standards or protocols. In addition, the network associated components 1030 may be combined with each other, together with the chip associated components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 includes other components that may or may not be physically or electrically connected to the mainboard 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, and may be any other electronic device able to process data.

Figure 2:
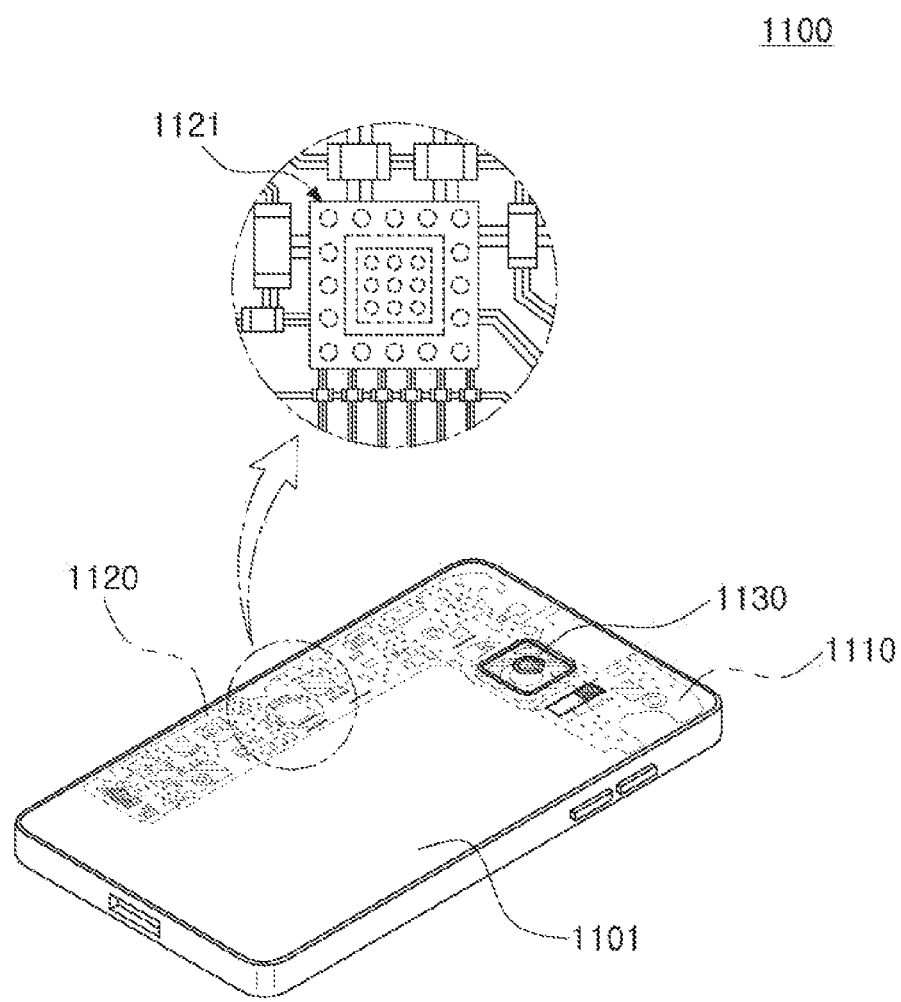
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a printed circuit board 1110 such as a mainboard may be accommodated in a body 1101 of a smartphone 1100, and various electronic components 1120 may be physically or electrically connected to the printed circuit board 1110. In addition, other components that may or may not be physically or electrically connected to the printed circuit board 1110, such as a camera module 1130, may be accommodated in the body 1101. Some of the electronic components 1120 may be the chip related components, for example, a semiconductor package 1121, but are not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a finished semiconductor product in itself, and may be damaged due to external physical or chemical impacts. Therefore, the semiconductor chip itself may not be used, but may be packaged and used in an electronic device, or the like, in a packaged state.

Here, semiconductor packaging is required due to the existence of a difference in a circuit width between the semiconductor chip and a mainboard of the electronic device in terms of electrical connections. In detail, a size of connection pads of the semiconductor chip and an interval between the connection pads of the semiconductor chip are very fine, but a size of component mounting pads of the mainboard used in the electronic device and an interval between the component mounting pads of the mainboard are significantly larger than those of the semiconductor chip. Therefore, it may be difficult to directly mount the semiconductor chip on the mainboard, and packaging technology for buffering a difference in a circuit width between the semiconductor chip and the mainboard is required.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-In Semiconductor Package

Figure 3A:
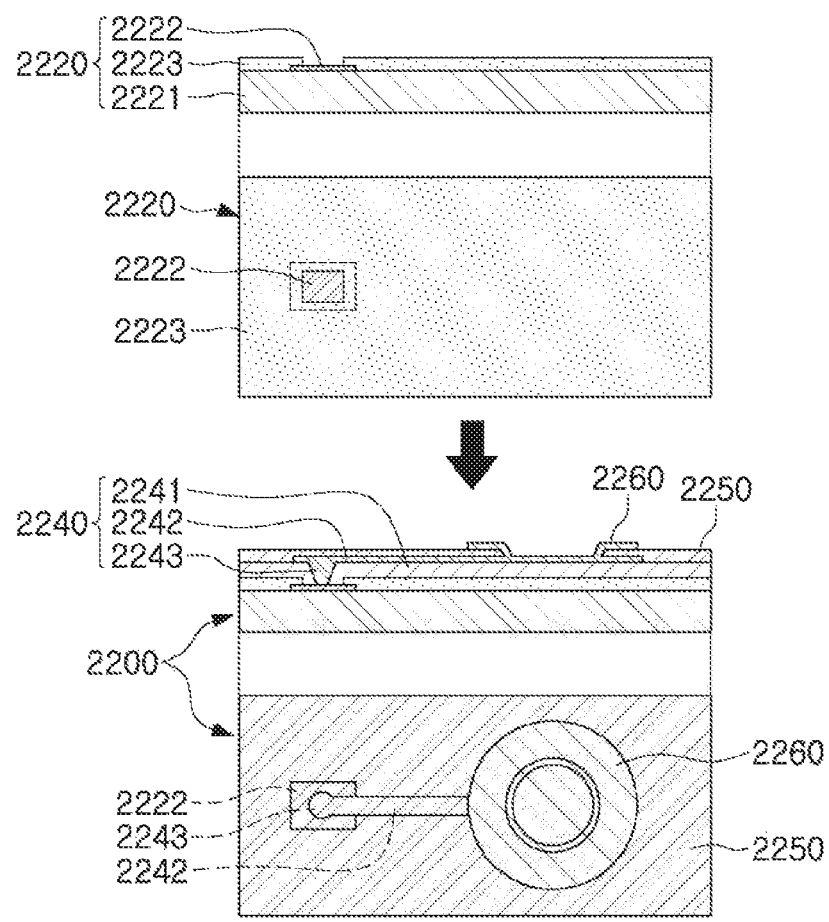
FIGS. 3A and 3B are schematic cross-sectional views illustrating states of a fan-in semiconductor package before and after being packaged.
Figure 3B:
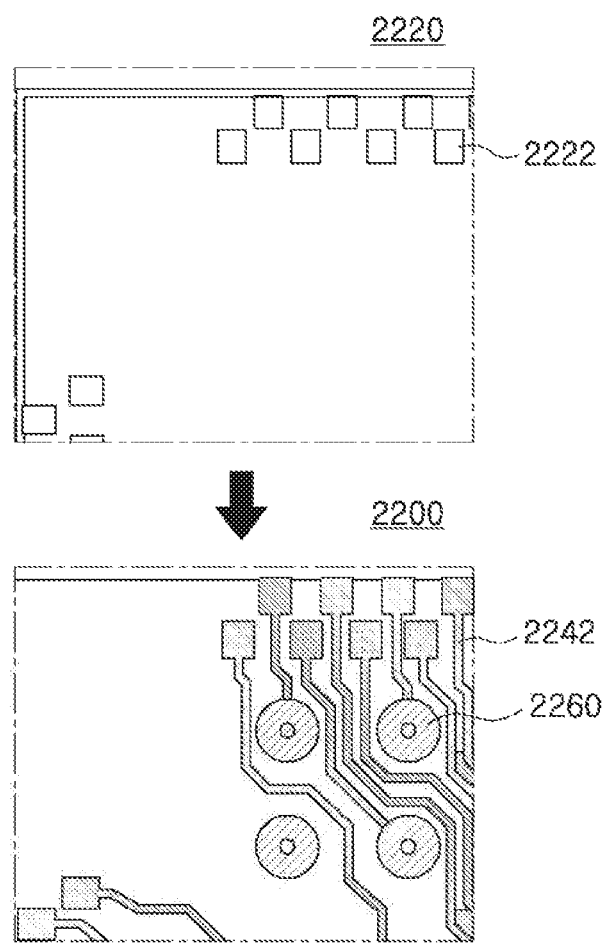

FIGS. 3A and 3B are schematic cross-sectional views illustrating states of a fan-in semiconductor package before and after being packaged.

Figure 4:
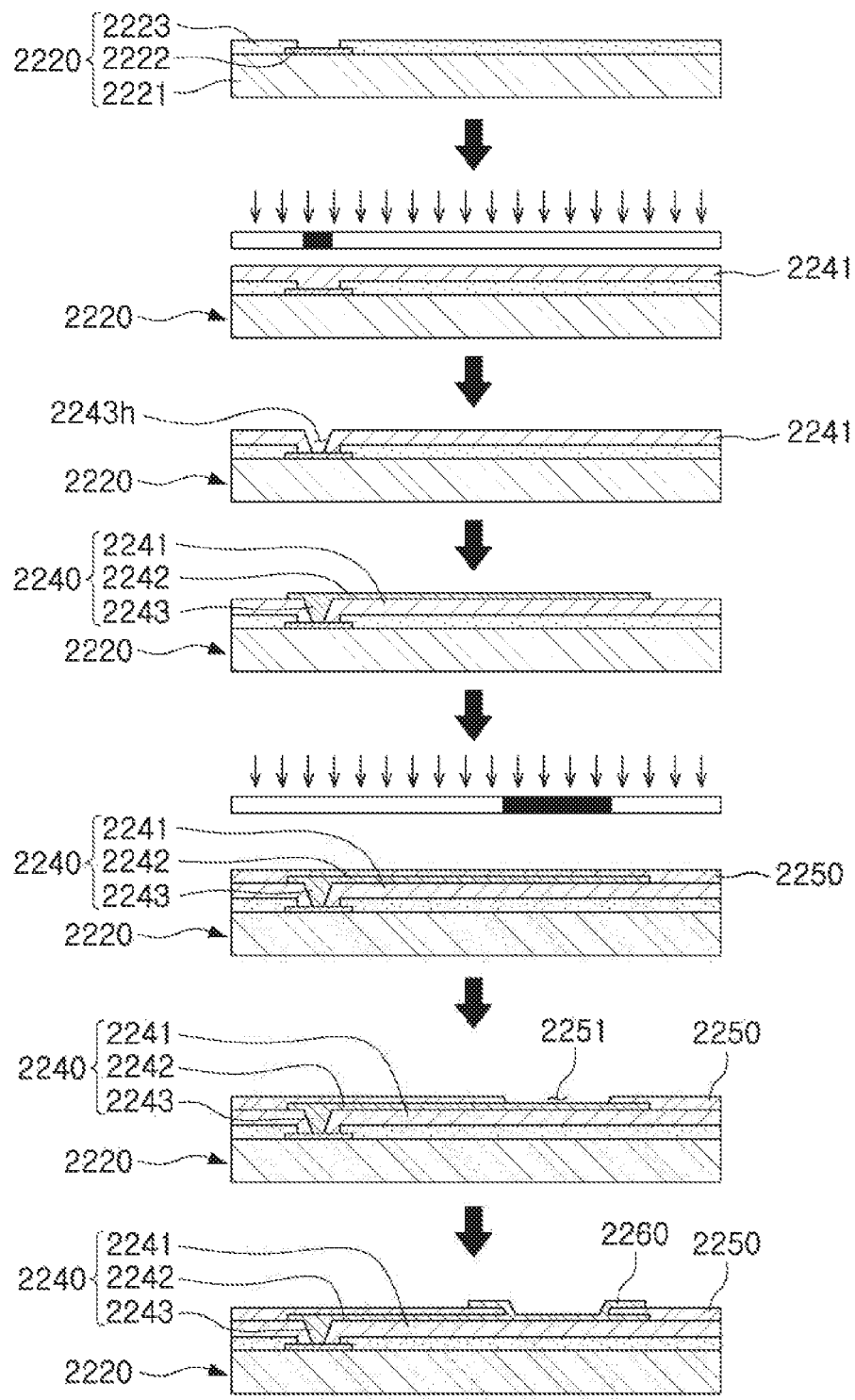
FIG. 4 is schematic cross-sectional views illustrating a packaging process of a fan-in semiconductor package.

FIG. 4 is schematic cross-sectional views illustrating a packaging process of a fan-in semiconductor package.

Referring to FIGS. 3A, 3B, and 4, a semiconductor chip 2220 may be, for example, an integrated circuit (IC) in a bare state, including a body 2221 including silicon (Si), germanium (Ge), gallium arsenide (GaAs), or the like, connection pads 2222 formed on one side of the body 2221 and including a conductive material such as aluminum (Al), or the like, and a passivation film 2223 such as an oxide layer, a nitride layer, or the like, formed on one side of the body 2221 and covering at least portions of the connection pads 2222. In this case, since the connection pads 2222 may be significantly small, it may be difficult to mount the integrated circuit (IC) on an intermediate level printed circuit board (PCB) as well as on the mainboard of the electronic device, or the like.

Therefore, a connection structure 2240 may be formed depending on a size of the semiconductor chip 2220 on the semiconductor chip 2220 in order to redistribute the connection pads 2222. The connection structure 2240 may be formed by forming an insulating layer 2241 on the semiconductor chip 2220 using an insulating material such as a photoimageable dielectric (PID) resin, forming via holes 2243h exposing the connection pads 2222, and then forming wiring patterns 2242 and vias 2243. Then, a passivation layer 2250 protecting the connection structure 2240 may be formed, an opening 2251 may be formed, and an underbump metal layer 2260, or the like, may be formed. That is, a fan-in semiconductor package 2200 including, for example, the semiconductor chip 2220, the connection structure 2240, the passivation layer 2250, and the underbump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has significant spatial limitations. Therefore, it is difficult to apply this structure to a semiconductor chip having a large number of I/O terminals or a semiconductor chip having a compact size. In addition, due to the disadvantage described above, the fan-in semiconductor package may not be directly mounted and used on the mainboard of the electronic device. Here, even in a case in which a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to directly mount the fan-in semiconductor package on the mainboard of the electronic device.

Figure 5:
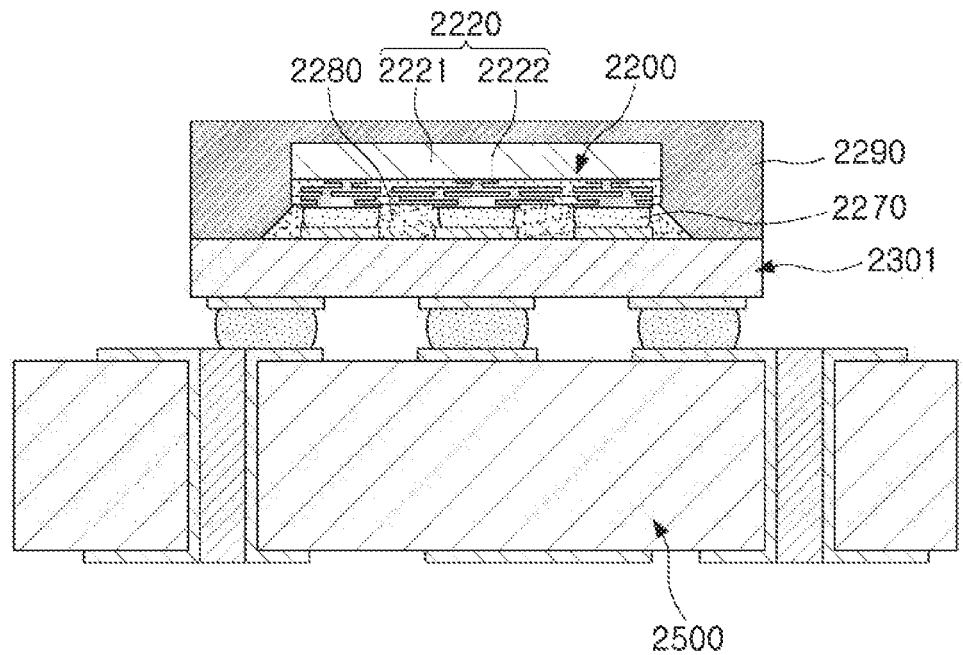
FIG. 5 is a schematic cross-sectional view illustrating a case in which a fan-in semiconductor package is mounted on a printed circuit board and is ultimately mounted on a mainboard of an electronic device.

FIG. 5 is a schematic cross-sectional view illustrating a case in which a fan-in semiconductor package is mounted on a printed circuit board and is ultimately mounted on a mainboard of an electronic device.

Figure 6:
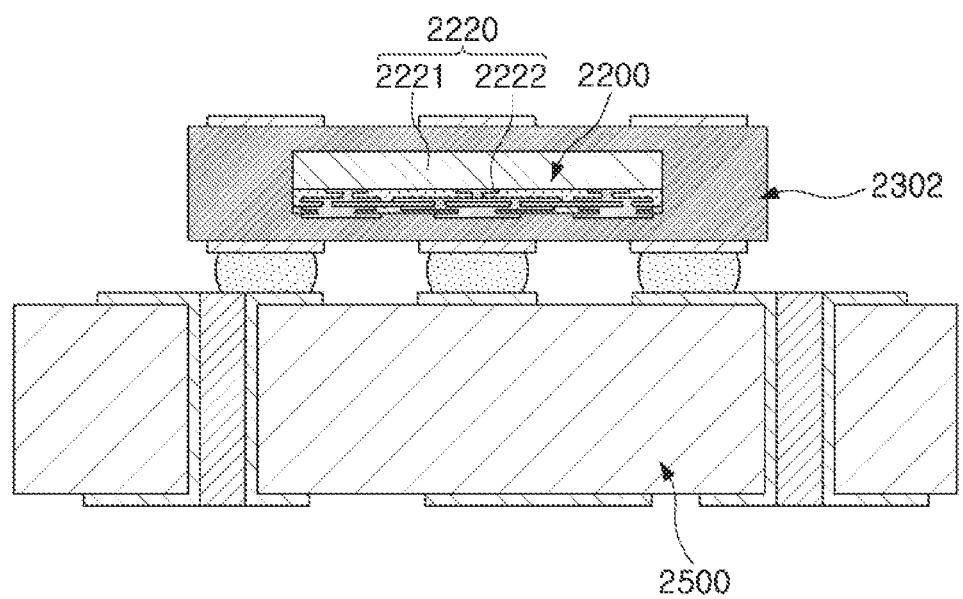
FIG. 6 is a schematic cross-sectional view illustrating a case in which a fan-in semiconductor package is embedded in a printed circuit board and is ultimately mounted on a mainboard of an electronic device.

FIG. 6 is a schematic cross-sectional view illustrating a case in which a fan-in semiconductor package is embedded in a printed circuit board and is ultimately mounted on a mainboard of an electronic device.

Referring to FIGS. 5 and 6, in a fan-in semiconductor package 2200, connection pads 2222, that is, I/O terminals, of a semiconductor chip 2220 may be redistributed through a printed circuit board 2301, and the fan-in semiconductor package 2200 may be ultimately mounted on a mainboard 2500 of an electronic device in a state in which it is mounted on the printed circuit board 2301. In this case, solder balls 2270, and the like, may be fixed by an underfill resin 2280, or the like, and an outer side of the semiconductor chip 2220 may be covered with a molding material 2290, or the like. Alternatively, a fan-in semiconductor package 2200 may be embedded in a separate printed circuit board 2302, connection pads 2222, that is, I/O terminals, of the semiconductor chip 2220 may be redistributed by the printed circuit board 2302 in a state in which the fan-in semiconductor package 2200 is embedded in the printed circuit board 2302, and the fan-in semiconductor package 2200 may ultimately be mounted on a mainboard 2500 of an electronic device.

As described above, it may be difficult to directly mount and use the fan-in semiconductor package on the mainboard of the electronic device. Therefore, the fan-in semiconductor package may be mounted on the separate printed circuit board and be then mounted on the mainboard of the electronic device through a packaging process or may be mounted and used on the mainboard of the electronic device in a state in which it is embedded in the printed circuit board.

Fan-Out Semiconductor Package

Figure 7:
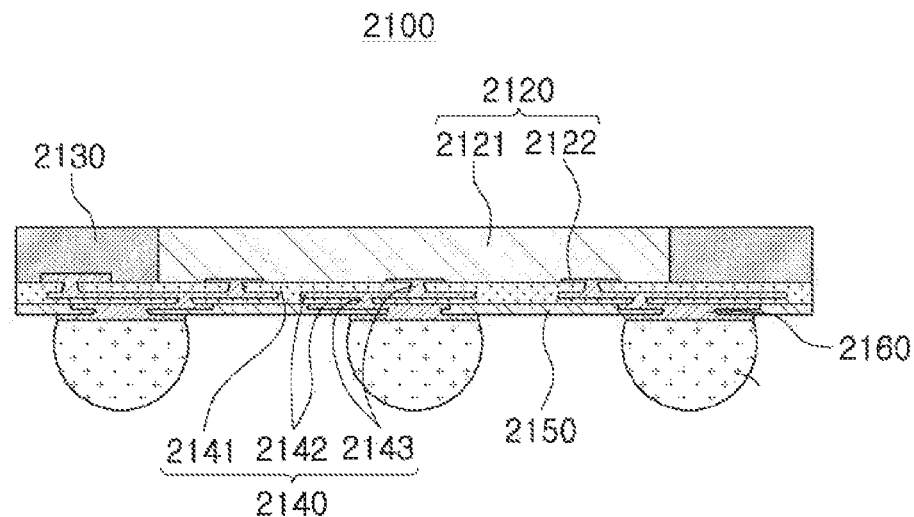
FIG. 7 is a schematic cross-sectional view illustrating a fan-out semiconductor package.

FIG. 7 is a schematic cross-sectional view illustrating a fan-out semiconductor package.

Referring to FIG. 7, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by a connection structure 2140. In this case, a passivation layer 2150 may further be formed on the connection structure 2140, and an underbump metal layer 2160 may further be formed in openings of the passivation layer 2150. Solder balls 2170 may further be formed on the underbump metal layer 2160. The semiconductor chip 2120 may be an integrated circuit (IC) including a body 2121, the connection pads 2122, and the like. The connection structure 2140 may include an insulating layer 2141, a redistribution layer 2142 formed on the insulating layer 2141, and a via 2143, electrically connecting the connection pad 2122 to the redistribution layer 2142.

As described above, the fan-out semiconductor package may have a form in which I/O terminals of the semiconductor chip are redistributed and disposed outwardly of the semiconductor chip through the connection structure formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection structure formed on the semiconductor chip as described above. Therefore, even in a case that a size of the semiconductor chip is decreased, a standardized ball layout may be used in the fan-out semiconductor package as it is, such that the fan-out semiconductor package may be mounted on the mainboard of the electronic device without using a separate printed circuit board, as described below.

Figure 8:
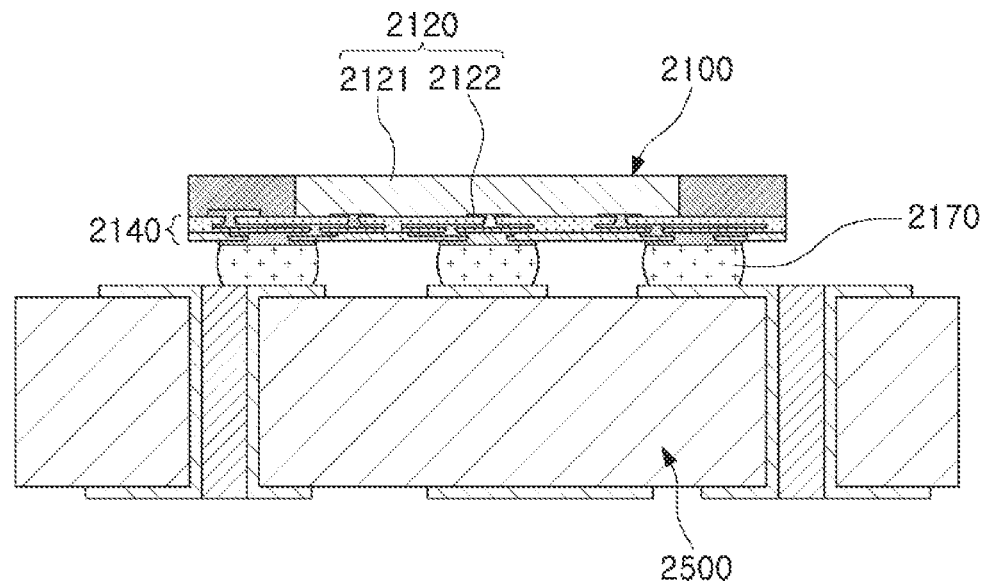
FIG. 8 is a schematic cross-sectional view illustrating a case in which a fan-out semiconductor package is mounted on a mainboard of an electronic device.

FIG. 8 is a schematic cross-sectional view illustrating a case in which a fan-out semiconductor package is mounted on a mainboard of an electronic device.

Referring to FIG. 8, a fan-out semiconductor package 2100 may be mounted on a mainboard 2500 of an electronic device through solder balls 2170, or the like. That is, as described above, the fan-out semiconductor package 2100 includes the connection structure 2140 formed on the semiconductor chip 2120 and capable of redistributing the connection pads 2122 to a fan-out region that is outside of a size of the semiconductor chip 2120, such that the standardized ball layout may be used in the fan-out semiconductor package 2100 as it is. As a result, the fan-out semiconductor package 2100 may be mounted on the mainboard 2500 of the electronic device without using a separate printed circuit board, or the like.

As described above, since the fan-out semiconductor package may be mounted on the mainboard of the electronic device without using the separate printed circuit board, the fan-out semiconductor package may be implemented at a thickness lower than that of the fan-in semiconductor package using the printed circuit board. Therefore, the fan-out semiconductor package may be miniaturized and thinned. In addition, the fan-out semiconductor package has excellent thermal characteristics and electrical characteristics, such that it is particularly appropriate for a mobile product. Therefore, the fan-out electronic component package may be implemented in a form more compact than that of a general package-on-package (POP) type using a printed circuit board (PCB), and may solve a problem due to the occurrence of a warpage phenomenon.

Meanwhile, the fan-out semiconductor package refers to package technology for mounting the semiconductor chip on the mainboard of the electronic device, or the like, as described above, and protecting the semiconductor chip from external impacts, and is a concept different from that of a printed circuit board (PCB) such as a printed circuit board, or the like, having a scale, a purpose, and the like, different from those of the fan-out semiconductor package, and having the fan-in semiconductor package embedded therein.

Hereinafter, an electronic component package capable of effectively shielding electromagnetic waves and improving the reliability of a shielding structure will be described with reference to the drawings.

Figure 9:
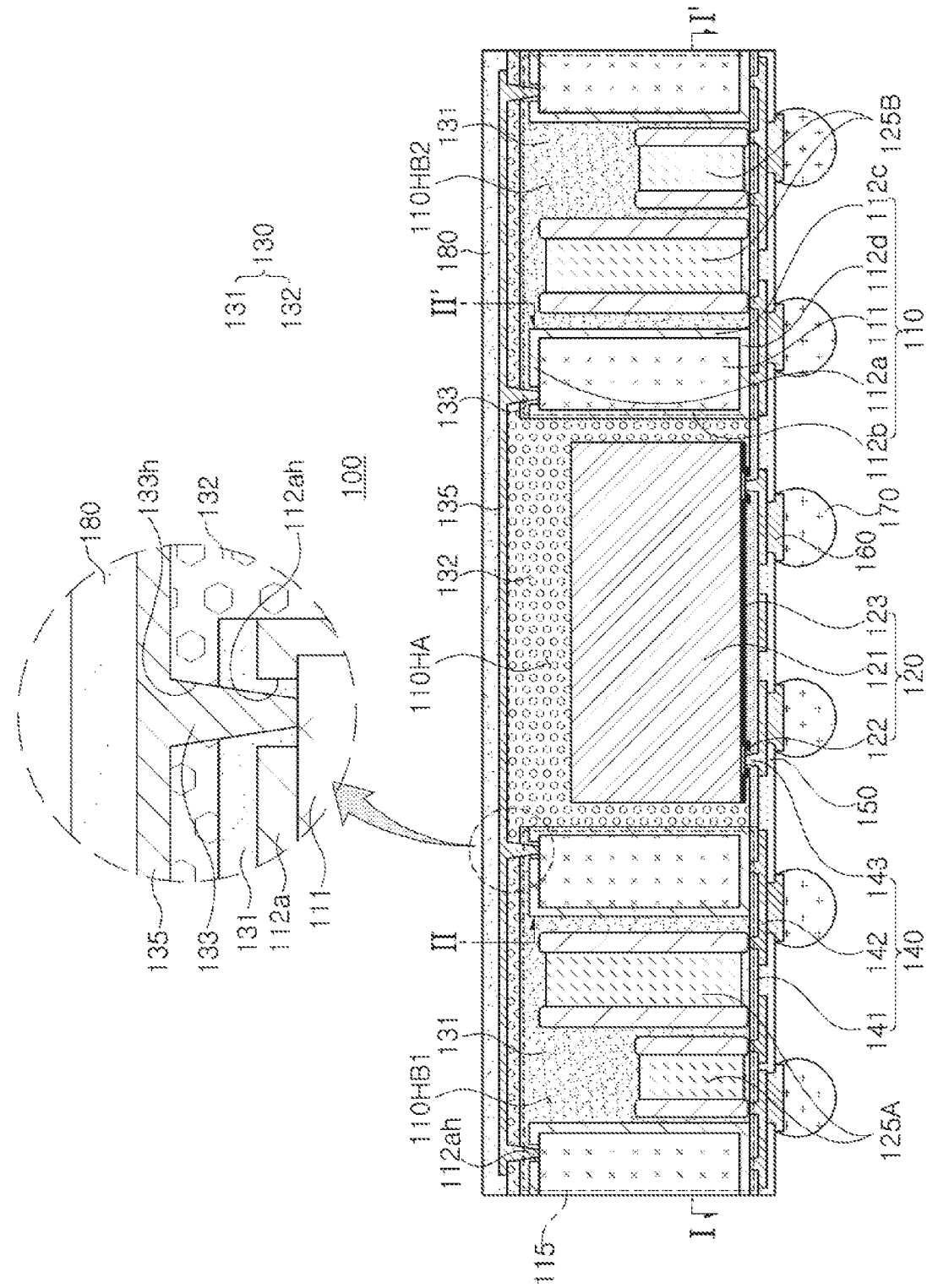
FIG. 9 is a schematic cross-sectional view illustrating an example of an electronic component package.

FIG. 9 is a schematic cross-sectional view illustrating an example of an electronic component package.

Figure 10:
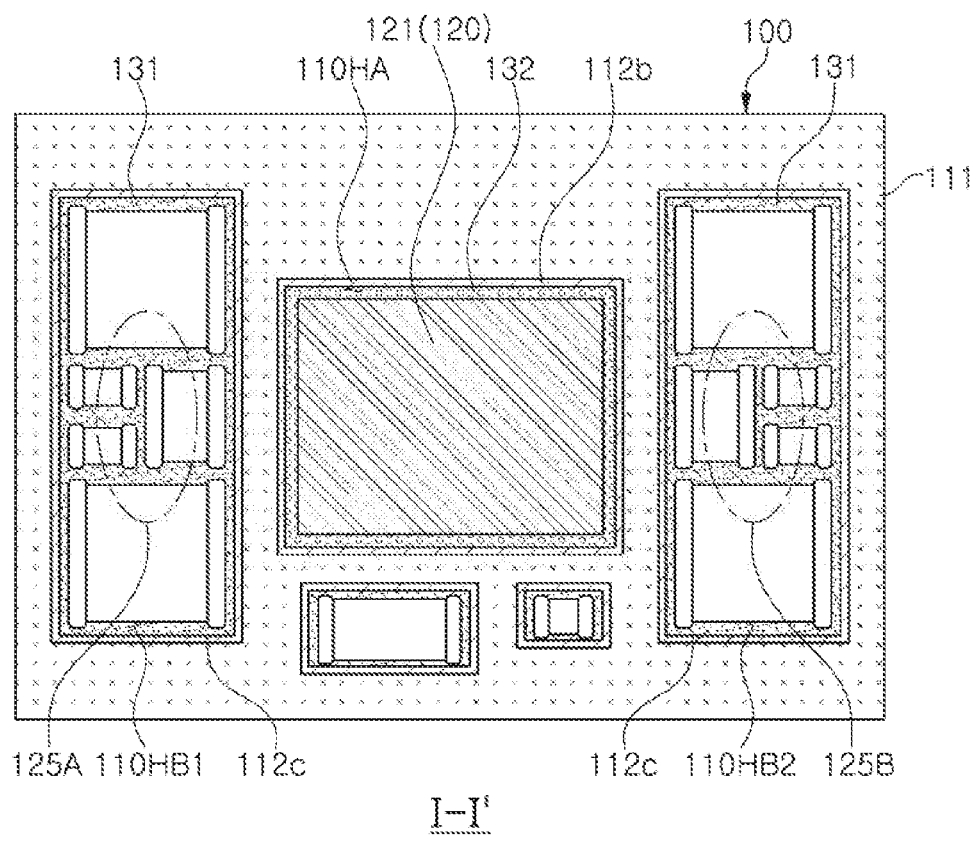
FIG. 10 is a schematic plan view of the electronic component package of FIG. 9 taken along line I-I'.

FIG. 10 is a schematic plan view of the electronic component package of FIG. 9 taken along line I-I'.

Figure 11:
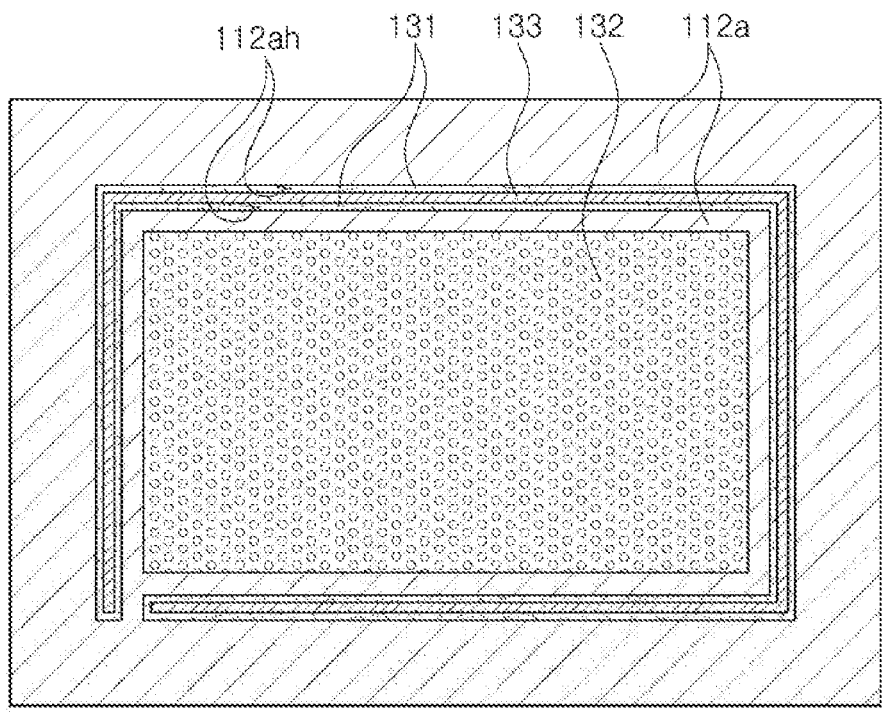
FIG. 11 is a schematic plan view of the electronic component package of FIG. 9 taken along line II-II'.

FIG. 11 is a schematic plan view of the electronic component package of FIG. 9 taken along line II-II'.

Referring to FIGS. 9, 10, and 11, an electronic component package 100 according to an exemplary embodiment may include a core member 110 including an insulating layer 111 having a first through-hole 110HA and second through-holes 110HB1 and 110HB2, and a first metal layer 112a, a second metal layer 112b, a third metal layer 112c, and a fourth metal layer 112d, disposed to surround the insulating layer 111, a semiconductor chip 120 disposed in the first through-hole 110HA, one or more passive components 125A and 125B disposed in the second through-holes 110HB1 and 110HB2, an encapsulant 130 encapsulating the semiconductor chip 120 and the passive components 125A and 125B and filling at least a portion of the first through-hole 110HA and the second through-holes 110HB1 and 110HB2, a connection member 140 disposed below the core member 110, the semiconductor chip 120, and the one or more passive components 125A and 125B, a backside metal layer 135 disposed on the encapsulant 130 and covering the semiconductor chip 120 and/or the one or more passive components 125A and 125B, a backside metal via 133 connecting the backside metal layer 135 to the insulating layer 111 while passing through the encapsulant 130, a passivation layer 150, an underbump metal 160, and an electrical connection structure 170, disposed below the connection member 140, and a cover layer 180 disposed on the encapsulant 130.

In the electronic component package 100 according to an exemplary embodiment, basically, the semiconductor chip 120 and one or more passive components 125A and 125B are accommodated in the through-holes 110HA, 110HB1, and 110HB2 of the core member 110. After sealing is performed using the encapsulant 130, an upper region of the semiconductor chip 120 and the one or more passive components 125A and 125B is surrounded through the backside metal layer 135 and the backside metal via 133. Thus, electromagnetic waves flowing inside or outside of an upper portion of the electronic component package 100 may be effectively shielded. Moreover, electromagnetic interference between the semiconductor chip 120 and the one or more passive components 125A and 125B in the electronic component package 100 may also be effectively shielded. In addition, the insulating layer 111 of the core member 110 may be surrounded by the metal layers 112a, 112b, 112c, and 112d. In detail, the metal layers 112b and 112c may be disposed on wall surfaces of the through-holes 110HA, 110HB1, and 110HB2, so the electromagnetic wave shielding effect described above may be further significantly increased. Moreover, a heat dissipation effect may be expected through the structure described above.

Meanwhile, according to the related art, a via opening for formation of the backside metal via 133 is required to pass through the encapsulant 130. In this regard, the via opening is formed using laser processing with a laser such as a CO2 laser. In this case, when the first metal layer 112a is opened by laser processing, the first metal layer 112a is attacked, so adhesion of an interface between the insulating layer 111 the first metal layer 112a is significantly deteriorated. Thus, a defect such as separation may occur later during a solder reflow process or a reliability test. Since a metal has high thermal conductivity, the defect described above may be diffused to not only a region of the first metal layer 112a, opened through a via opening, but also a periphery thereof. As a result, a problem of deterioration of adhesiveness may occur in a wide range.

On the other hand, in the electronic component package 100 according to an exemplary embodiment, the backside metal via 133 is in contact with an upper surface of the insulating layer 111, rather than a first metal layer 112a formed on the upper surface of the insulating layer 111 of the core member 110. For example, even when the first metal layer 112a is formed on the upper surface of the insulating layer 111 of the core member 110, a groove portion 112ah is formed in the first metal layer 112a, so the upper surface of the insulating layer 111 may be open. Thus, the backside metal via 133 may be in contact with the upper surface of the insulating layer 111, exposed through the groove portion 112ah rather than the first metal layer 112a. In other words, when a via opening 133h is formed by laser processing to form the backside metal via 133, a portion, exposed through laser processing, is the insulating layer 111 rather than the first metal layer 112a. In this case, the first metal layer 112a is not removed by laser processing. Furthermore, the insulating layer 111 has low thermal conductivity. In this regard, the above described problem in which adhesion between the first metal layer 112a and the insulating layer 111 is deteriorated may be solved.

Meanwhile, the backside metal via 133 may have a predetermined path along an upper surface of the insulating layer 111. In other words, the backside metal via 133 may have a form of a line via. In this case, electromagnetic wave shielding may be performed more effectively. From a similar point of view, a groove portion 112ah formed in a first metal layer 112a, in which a backside metal via 133 is formed, may have a trench form having a predetermined path along an upper surface of the insulating layer 111.

Figure 13:
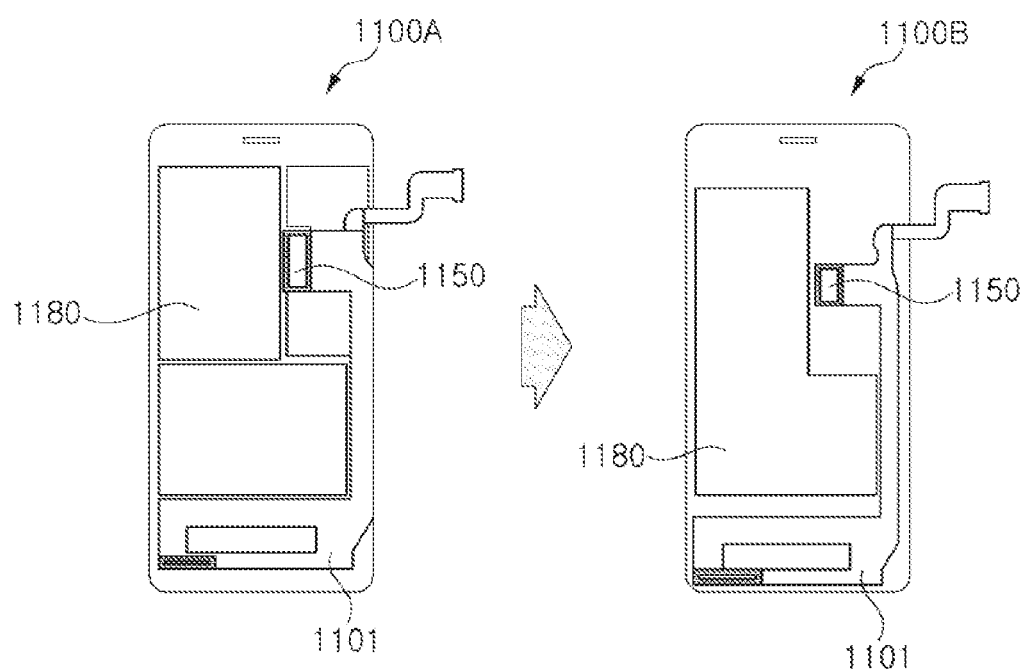
FIG. 13 is a schematic plan view illustrating an additional effect in a case in which the electronic component package according to the disclosure is applied to an electronic device.

Meanwhile, in the electronic component package 100 according to an exemplary embodiment, a plurality of passive components 125A and 125B are disposed in a single package together with the semiconductor chip 120 to be modularized. Thus, a distance between components may be significantly reduced, so a mounting area on a printed circuit board such as a mainboard may be significantly reduced. For example, as illustrated in FIG. 13, in recent years, as a size of a display for mobile devices 1100A and 1100B is increased, the necessity of increasing battery capacity is also increased. Here, due to an increase in the battery capacity, an area occupied by the battery 1180 is increased. To this end, a reduction in a size of the printed circuit board 1101 such as a mainboard is required. Thus, due to a reduction in a mounting area of a component, an area occupied by a module 1150 including a power management integrated circuit (PMIC) and passive components is gradually decreased. In this case, when the electronic component package 100 according to an exemplary embodiment is applied to the module 1150, a size is able to be reduced. Thus, the area, which is decreased as described, above may be effectively used. Moreover, an electrical path between the semiconductor chip 120 and the passive components 125A and 125B may be significantly reduced, so a noise problem may be solved.

Meanwhile, the encapsulant 130 may include a first encapsulant 131 covering at least a portion of each of the core member 110 and one or more passive components 125A and 125B and filling at least a portion of each of the second through-holes 110HB1 and 110HB2, and a second encapsulant 132 covering at least a portion of each of the first encapsulant 131 and the inactive surface of the semiconductor chip 120 and filling at least a portion of the first through-hole 110HA. In this case, two or more sealing processes are performed rather than a single sealing process, thereby significantly reducing the yield problem of the semiconductor chip 120, caused by a mounting defect of the passive components 125A and 125B, or an effect of a foreign material, generated when the passive components 125A and 125B are mounted.

Meanwhile, the electronic component package 100 according to an exemplary embodiment may only have a semiconductor chip 120 depending on a field of application, or may only have passive components 125A and 125B. The electronic component package 100 according to an exemplary embodiment may be a semiconductor package, when the semiconductor chip 120 is included. Alternatively, the electronic component package may be a component package, when only passive components 125A and 125B are included without the semiconductor chip 120. Moreover, the first metal layer 112a, the second metal layer 112b, the third metal layer 112c, and the fourth metal layer 112d may be selectively formed on the insulating layer 111 of the core member 110. In addition, the passivation layer 150, the underbump metal 160, the electrical connection structure 170, and the cover layer 180, and the like may be selectively omitted as needed.

The respective components included in the electronic component package 100 according to the exemplary embodiment will hereinafter be described below in more detail.

The core member 110 may allow rigidity of the electronic component package 100 to be improved according to a material of the insulating layer 111, and may allow thickness uniformity of the encapsulant 130 to be secured. The first through-hole 110HA and the second through-holes 110HB1 and 110HB2, passing through the insulating layer 111, may be formed in the core member 110, while the semiconductor chip 120 and the one or more passive components 125A and 125B may be disposed in each of the through-holes 110HA, 110HB1, and 110HB2. Each of the through-holes 110HA, 110HB1, and 110HB2 may surround the semiconductor chip 120 and one or more passive components 125A and 125B, but is not limited thereto.

The core member 110 includes an insulating layer 111. A material of the insulating layer 111 is not particularly limited. For example, an insulating material may be used as the material of the insulating layer 111. In this case, the insulating material may be a thermosetting resin such as an epoxy resin, a thermoplastic resin such as a polyimide resin, a resin in which the thermosetting resin or the thermoplastic resin is impregnated together with an inorganic filler such as silica in a core material such as a glass fiber (or a glass cloth or a glass fabric), for example, prepreg, ABF, or the like. The insulating layer 111 may have a single layer structure, or a multilayer structure.

In the core member 110, the first metal layer 112a may be disposed on an upper surface of the insulating layer 111, the second metal layer 112b may be disposed on a wall surface of the first through-hole 110HA, the third metal layer 112c may be disposed on a wall surface of each of the second through-holes 110HB1 and 110HB2, and the fourth metal layer 112d may be disposed on a lower surface of the insulating layer 111. Each of the first metal layer 112a, the second metal layer 112b, the third metal layer 112c, and the fourth metal layer 112d may include copper (Cu), aluminum (Al), silver (Ag), tin (Sn), gold (Au), nickel (Ni), lead (Pb), titanium (Ti), or alloys thereof, but are not limited thereto. Electromagnetic shielding and heat dissipation, of the semiconductor chip 120 and one or more passive components 125A and 125B, may be achieved through the first metal layer 112a, the second metal layer 112b, the third metal layer 112c, and the fourth metal layer 112d. The first metal layer 112a, the second metal layer 112b, the third metal layer 112c, and the fourth metal layer 112d may be connected to each other, and may be used as a ground. In this case, the first metal layer, the second metal layer, the third metal layer, and the fourth metal layer may be electrically connected to a ground of a redistribution layer 142 of the connection member 140.

The core member 110 may further include a wiring layer disposed on an upper surface and/or a lower surface of the insulating layer 111 as needed. Moreover, a through wiring passing through the insulating layer 111 and electrically connecting a wiring layer disposed on an upper surface and/or a lower surface of the insulating layer 111 may be further included. When the insulating layer 111 includes multiple layers, a wiring layer may be disposed between insulating layers 111. In this case, the through wiring may include a plurality of connection via layers. Wiring layers of the core member 110 may be electrically connected to the connection pad 122 of the semiconductor chip 120 and one or more passive components 125A and 125B.

The core member 110, the second through-holes 110HB1 and 110HB2, one or more passive components 125A and 125B, and the first encapsulant 131 may form a core structure 115. In this case, a non-photosensitive insulating layer such as ABF, or the like may be only disposed in a lower side of the core structure 115 as needed, and a wiring layer for primary redistribution of one or more passive components 125A and 125B may be disposed on a lower surface of the non-photosensitive insulating layer. The wiring layer may be electrically connected to one or more passive components 125A and 125B through a connection via passing through the non-photosensitive insulating layer.

The semiconductor chip 120 may be an integrated circuit (IC) provided in an amount of several hundred to several million or more elements integrated in a single chip. In this case, the IC chip may be a power management IC (PMIC), without limitation, and may be a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphic processor (for example, a graphic processing unit (GPU)), a digital signal processor, a cryptographic processor, a microprocessor, a microcontroller, or the like; and a logic chip such as an analog-to-digital converter (ADC), an application-specific integrated circuit (ASIC), or the like.

The semiconductor chip 120 may be an integrated circuit in a bare state in which a separate bump or a redistribution layer is not provided. The integrated circuit may be provided based on an active wafer. In this case, a base material of a body 121 of the semiconductor chip 120 may be silicon (Si), germanium (Ge), gallium arsenide (GaAs), or the like. Various circuits may be formed on the body 121. The connection pads 122 may electrically connect the semiconductor chip 120 to other components. A material of each of the connection pads 122 may be a conductive material such as aluminum (Al), or the like. A passivation layer 123 exposing the connection pads 122 may be formed on the body 121, and the passivation layer 123 may be an oxide layer, a nitride layer, or the like, or a double layer of an oxide layer and a nitride layer. An insulating layer (not illustrated), and the like, may also be further disposed in other required positions. Meanwhile, in the semiconductor chip 120, a surface on which the connection pad 122 is disposed is an active surface, and an opposite surface is an inactive surface. In this case, when the passivation film 123 is formed on the active surface of the semiconductor chip 120, the positional relationship of the active surface of the semiconductor chip 120 is determined based on a lowermost surface of the passivation film 123.

Each of the passive components 125A and 125B may be a capacitor such as a multilayer ceramic capacitor (MLCC) or a low inductance chip capacitor (LICC), an inductor such as a power inductor, a bead, or the like, independently. The passive components 125A and 125B may have different thicknesses. The passive components 125A and 125B may have thicknesses different from a thickness of the semiconductor chip 120. In the electronic component package 100 according to an exemplary embodiment, encapsulating is performed through two or more operations, so a problem of a defect caused by a thickness variation may be significantly reduced. The number of the passive components 125A and 125B is not particularly limited, and may be greater or less than that illustrated in the drawings. The passive components 125A and 125B may be electrically connected to the connection pad 122 of the semiconductor chip 120 through the redistribution layer 142 of the connection member 140.

The first encapsulant 131 may encapsulate each of the passive components 125A and 125B. Moreover, the first encapsulant may fill at least a portion of each of the second through-holes 110HB1 and 110HB2. In addition, in an exemplary example, the first encapsulant 131 may also cover the core member 110. The first encapsulant 131 may include an insulating material. The insulating material may be a material containing an inorganic filler and an insulating resin, for example, a thermosetting resin such as an epoxy resin, a thermoplastic resin such as a polyimid, or a resin in which a reinforcing material such as an inorganic filler is contained in the thermosetting resin or the thermoplastic resin, in detail, an Ajinomoto build-up film (ABF), an FR-4 resin, a bismaleimide triazine (BT) resin, a resin, or the like. Moreover, a molding material such as EMC may be used, or a photosensitive material, that is, a photoimageable encapsulant (PIE) may be used, as needed. As needed, a material in which an insulating resin such as the thermosetting resin or the thermoplastic resin is impregnated in a core material such as an inorganic filler and/or a glass fiber (or a glass cloth or a glass fabric), may be used.

The second encapsulant 132 may encapsulate the semiconductor chip 120. Moreover, the second encapsulant may fill at least a portion of the first through-hole 110HA. In addition, in an exemplary example, the second encapsulant may also cover the first encapsulant 131. The second encapsulant 132 may also include an insulating material. The insulating material may be a material containing an inorganic filler and an insulating resin, for example, a thermosetting resin such as an epoxy resin, a thermoplastic resin such as a polyimid, or a resin in which a reinforcing material such as an inorganic filler is contained in the thermosetting resin or the thermoplastic resin, in detail, an Ajinomoto build-up film (ABF), an FR-4 resin, a bismaleimide triazine (BT) resin, a PID resin, or the like. In addition, a known molding material, such as an epoxy molding compound (EMC), may also be used. As needed, a material in which an insulating resin such as the thermosetting resin or the thermoplastic resin is impregnated in a core material such as an inorganic filler and/or a glass fiber (or a glass cloth or a glass fabric), may be used.

The first encapsulant 131 and the second encapsulant 132 may include the same material, or may include different materials. Even when the first encapsulant 131 and the second encapsulant 132 include the same material, a boundary therebetween may be determined. The first encapsulant 131 and the second encapsulant 132 may include similar materials, but colors thereof may be different. For example, the first encapsulant 131 may be more transparent than the second encapsulant 132. In other words, the boundary therebetween may be distinguished. As needed, the first encapsulant 131 is provided as an insulating material, while the second encapsulant 132 may be provided as a magnetic material. In this case, the second encapsulant 132 may have an EMI absorption effect. In the case of the semiconductor chip 120, an electrode is not open through the body 121. Here, when the second encapsulant 132 is provided as a magnetic material, a problem caused thereby may not occur.

The backside metal layer 135 may be disposed on the encapsulant 130, in detail, the second encapsulant 132, to cover the inactive surface of the semiconductor chip 120 and/or one or more passive components 125A and 125B. The backside metal via 133 may allow the backside metal layer 135 to be connected to an upper surface of the insulating layer 111 of the core member 110 while passing through the encapsulant 130, in detail, the first encapsulant 131 and the second encapsulant 132. The backside metal via 133 may be in contact with an upper surface of the insulating layer 111 of the core member 110. The upper surface of the insulating layer 111, connected to the backside metal via 133, may be exposed through a groove portion 112*ah* of the first metal layer 112*a*. The backside metal via 133 and/or the groove portion 122*ah* may have a predetermined path along the upper surface of the insulating layer 111 of the core member 110. Through the backside metal layer 135 and the backside metal via 133, an upper region of the semiconductor chip 120 and one or more passive components 125A and 125B may be surrounded by a metal material, so an electromagnetic shielding effect and heat radiation effect may be achieved. The backside metal layer 135 and the backside metal via 133 may also include a conductive material such as copper (Cu), aluminum (Al), silver (Ag), tin (Sn), gold (Au), nickel (Ni), lead (Pb), titanium (Ti), or alloys thereof.

The connection member 140 may redistribute the connection pad 122 of the semiconductor chip 120. Moreover, the connection member may 140 allow the semiconductor chip 120 to be electrically connected to one or more passive components 125A and 125B. Several tens to several hundreds of connection pads 122, of the semiconductor chip 120, having various functions may be redistributed by the connection member 140, and may be physically or electrically externally connected through the electrical connection structure 170 depending on the functions. The connection member 140 may include an insulating layer 141, disposed below the core structure 115 and the semiconductor chip 120, a redistribution layer 142 disposed on a lower surface of the insulating layer 141, and a connection via 143 passing through the insulating layer 141 and electrically connecting the redistribution layer 142 to the connection pad 122 of the semiconductor chip 120 and/or one or more passive components 125A and 125B. The insulating layer 141, the redistribution layer 142, and the connection via 143 may include the number of layers, greater than that of the connection member 140.

A material of the insulating layer 141 may be an insulating material, in more detail, a photosensitive insulating material (PID). When the photosensitive insulating material (PID) is used, a fine pitch of the connection via 143 may be introduced through a photovia, so tens to hundreds of connection pads 122 of the semiconductor chip 120 may be effectively redistributed.

The redistribution layer 142 redistributes the connection pad 122 of the semiconductor chip 120 and/or an electrode of one or more passive components 125A and 125B to be electrically connected to the connection pad 122 of the semiconductor chip 120. A material of the redistribution layer 142 may be a conductive material such as copper (Cu), aluminum (Al), silver (Ag), tin (Sn), gold (Au), nickel (Ni), lead (Pb), titanium (Ti), or alloys thereof. The redistribution layer 142 may perform various functions depending on designs of its corresponding layer. For example, the redistribution layer may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. Moreover, the redistribution layer may include a via pad, an electrical connection structure pad, or the like.

The connection via 143 may allow the redistribution layer 142, the connection pad 122, electrodes of the passive components 125A and 125B, and the like, formed on different layers, to be electrically connected to each other. A material of the connection via 143 may also be a conductive material such as copper (Cu), aluminum (Al), silver (Ag), tin (Sn), gold (Au), nickel (Ni), lead (Pb), titanium (Ti), or alloys thereof. The connection via 143 may be completely filled with a conductive material, or the conductive material may be formed along a wall of each of via holes. The connection via 143 may have a taped shape.

The passivation layer 150 may protect the connection member 140 from external physical or chemical damage. The passivation layer 150 may have an opening exposing at least a portion of the redistribution layer 142 of the connection member 140. The number of openings formed in the passivation layer 150 may be several tens to several thousands. The passivation layer 150 may be ABF, but is not limited thereto.

The underbump metal layer 160 may increase connection reliability of the electrical connection structure 170, resulting in an improvement in board level reliability of the electronic component package 100. The underbump metal 160 may be connected to the redistribution layer 142 of the connection member 140, which is exposed through an opening of the passivation layer 150. The underbump metal 160 may be formed in opening of the passivation layer 150 by any known metallization method using any known conductive metal such as a metal, but is not limited thereto.

The electrical connection structure 170 allows the electronic component package 100 to be physically and/or electrically connected to an external source. For example, the electronic component package 100 may be mounted on a mainboard of an electronic device through the electrical connection structure 170. The electrical connection structure 170 may be formed of a low melting point metal, for example, tin (Sn) or an alloy including tin (Sn). In more detail, the electrical connection structure may be formed of a solder, or the like. However, this is only an example, and a material of the electrical connection structure is not limited thereto. The electrical connection structure 170 may be a land, a ball, a pin, or the like. The electrical connection structure 170 includes a single layer or a plurality of layers. When the electrical connection structure 170 includes the plurality of layers, the electrical connection structure includes a copper pillar and a solder. When the electrical connection structure includes the single layer, the electrical connection structure includes a tin-silver solder or copper. However, the electrical connection structure is only an example, and the present disclosure is not limited thereto. The number, an interval, a disposition, or the like, of the electrical connection structure 170 is not particularly limited, and may be sufficiently modified by a person skilled in the art depending on design particulars. For example, the electrical connection structure 170 may be provided in an amount of several tens to several thousands according to the number of connection pads 122, or may be provided in an amount of several tens to several thousands or more or several tens to several thousands or less.

At least one of the electrical connection structures 170 may be disposed in a fan-out region. The fan-out region refers to a region except for a region in which the semiconductor chip 120 is disposed. The fan-out package may have excellent reliability as compared to a fan-in package, may allow a plurality of input/output (I/O) terminals to be implemented, and may facilitate a 3D interconnection. In addition, as compared to a ball grid array (BGA) package, a land grid array (LGA) package, or the like, the fan-out package may be manufactured to have a small thickness, and may have price competitiveness.

The cover layer 180 may protect the backside metal layer 135 from external physical or chemical damage. The cover layer 180 may cover at least a portion of the backside metal layer 135. The passivation layer 180 may be ABF, but is not limited thereto.

Figure 12A:
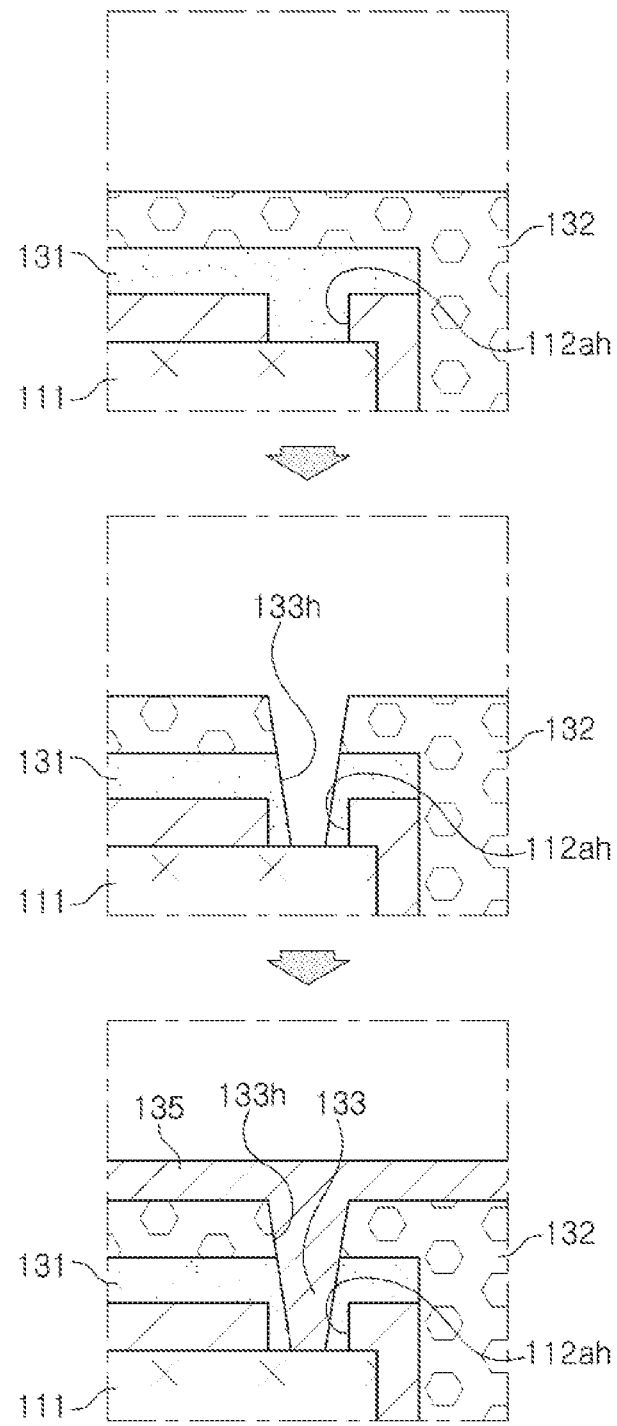
FIGS. 12A and 12B illustrate an example of manufacturing a backside metal via of the electronic component package of FIG. 9.
Figure 12B:
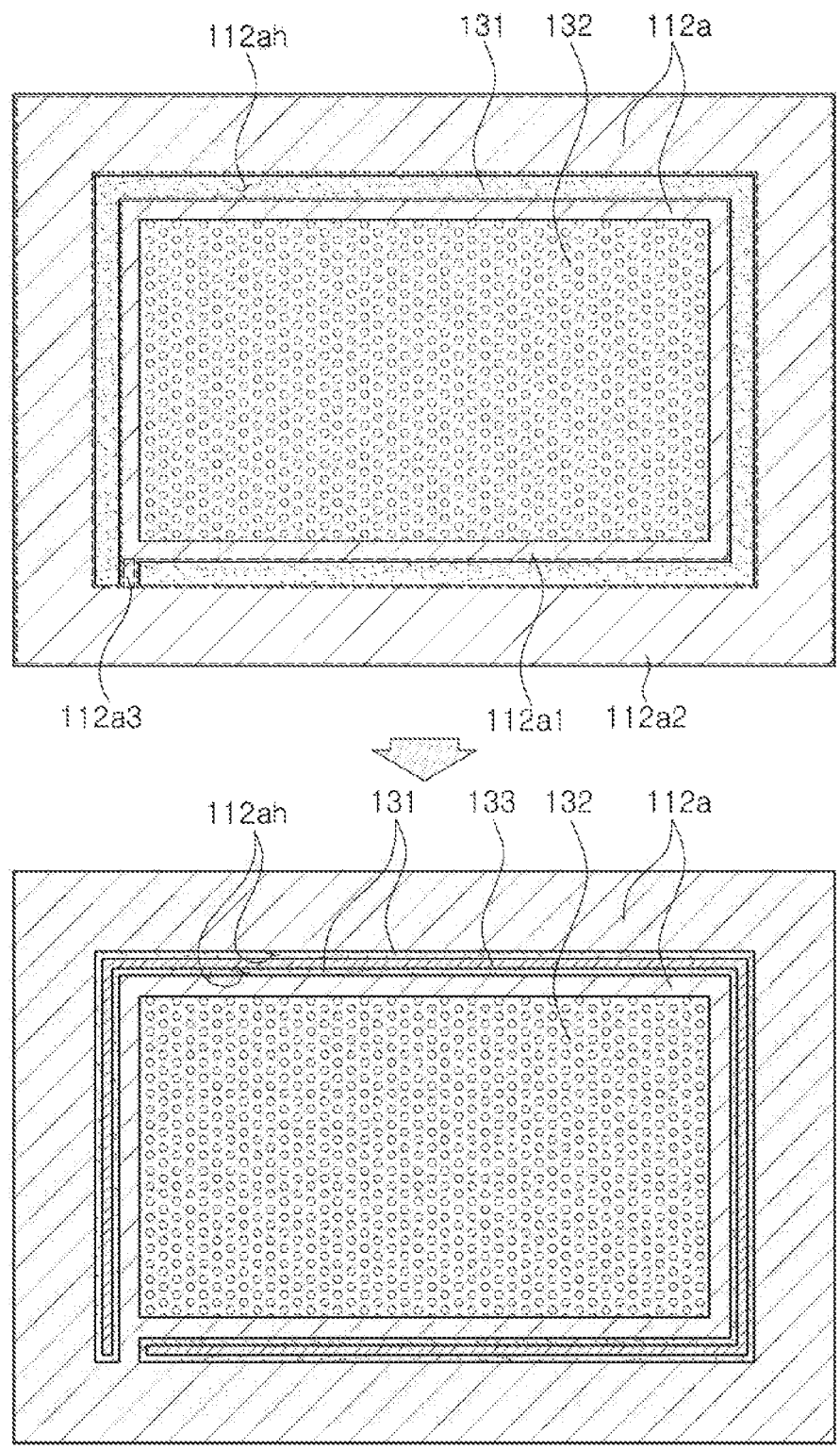

FIGS. 12A and 12B illustrate an example of manufacturing a backside metal via of the electronic component package of FIG. 9.

Referring to FIG. 12A, a core member 110 including an insulating layer 111 and a first metal layer 112a disposed on an upper surface of the insulating layer 111 and having a groove portion 112ah may be prepared first. The first metal layer 112a may be covered by the first encapsulant 131, while the groove portion 112ah may be filled with the first encapsulant 131. Moreover, the first encapsulant 131 may be covered by the second encapsulant 132. Then, through laser processing, a via opening 133h exposing a portion of an upper surface of the insulating layer 111 in the groove portion 112ah is provided. At least a portion of the groove portion 112ah is still filled with the first encapsulant 131. Then, using a known plating process, the via opening 133h is filled with a metal material, thereby forming the backside metal via 133. At the same time, a backside metal layer 135 is formed on the second encapsulant 132. The backside metal layer 135 and the backside metal via 133 are simultaneously provided by plating to be integrated.

Referring to FIG. 12B, a first metal layer 112a may include a first metal portion 112a1 disposed in an inner side based on the groove portion 112ah, a second metal portion 112a2 in an outer side, and a metal connection portion 112a3 intersecting the groove portion 112ah and connecting the first metal portion 112a1 to the second metal portion 112a2. As described above, when the metal connection portion 112a3 connecting the first metal portion 112a1 to the second metal portion 112a2 is formed at a minimal point to conduct both, the first metal portion and the second metal portion, adhesive deterioration may be significantly reduced. In other words, as compared with a case in which the first metal portion 112a1 and the second metal portion 112a2 are completely physically spaced apart from each other by a groove portion 112ah in the form of a trench having a predetermined path, conducting at a minimal point as described above is preferable in terms of reliability. Then, the backside metal via 133 may be formed in the groove portion 112ah. The backside metal via 133 may be provided in the form of a line via to have a predetermined length in a manner similar to the groove portion 112ah. Meanwhile, if the metal connection portion 112a3, that is, a conducting portion of the first metal portion 112a1 and the second metal portion 112a2, is formed to be significantly wide, or the number of the metal connection portions is significant, the electromagnetic wave shielding efficiency may be reduced. Thus, the metal connection portion 112a3 is preferably formed to be minimal.

As set forth above, according to an exemplary embodiment, an electronic component package capable of effectively shielding electromagnetic waves, and improving reliability of a shielding structure may be provided.

While exemplary embodiments have been shown and described above, it will be apparent to those skilled in the art that modifications and variations could be made without departing from the scope of the present invention as defined by the appended claims.

What is claimed is:

1. An electronic component package, comprising:
    a core member including an insulating layer, and having a first through-hole passing through the insulating layer;
    a semiconductor chip disposed in the first through-hole, and having an active surface on which a connection pad is disposed and an inactive surface opposing the active surface;
    an encapsulant covering at least a portion of each of the core member and the inactive surface of the semiconductor chip, and filling at least a portion of the first through-hole;
    a connection member disposed on the core member and the active surface of the semiconductor chip, and including a redistribution layer electrically connected to the connection pad;
    a backside metal layer disposed on the encapsulant, and covering at least the inactive surface of the semiconductor chip; and
    a backside metal via passing through the encapsulant, and connecting the backside metal layer to one side of the insulating layer,
    wherein a lowermost surface of the backside metal via is in contact with the one side of the insulating layer.

2. The electronic component package of claim 1, wherein the core member further includes a first metal layer disposed on the one side of the insulating layer and having at least a portion covered by the encapsulant,
    the first metal layer has a groove portion exposing the one side of the insulating layer, and
    the backside metal via is in contact with the one side of the insulating layer, exposed by the groove portion.

3. The electronic component package of claim 2, wherein the encapsulant fills the groove portion of the first metal layer and separates the first metal layer from the backside metal via.

4. The electronic component package of claim 2, wherein the groove portion has a predetermined path along the one side of the insulating layer.

5. The electronic component package of claim 4, wherein the backside metal via has a predetermined path along the one side of the insulating layer.

6. The electronic component package of claim 4, wherein the first metal layer includes a first metal portion and a second metal portion disposed in an inner side and an outer side based on the groove portion, respectively, and spaced apart from each other by a predetermined distance by the groove portion, and a metal connection portion connecting the first metal portion to the second metal portion while intersecting a point of the groove portion.

7. The electronic component package of claim 2, wherein the core member further includes a second metal layer disposed on a wall surface of the first through-hole, and
    the second metal layer is connected to the first metal layer.

8. The electronic component package of claim 7, wherein the core member further includes a third metal layer disposed on another side of the insulating layer opposing the one side of the insulating layer, and
    the first and third metal layer are connected to each other by the second metal layer.

9. The electronic component package of claim 2, wherein the core member further has a second through-hole spaced apart from the first through-hole,
    one or more passive components are disposed in the second through-hole, and
    the one or more passive components are electrically connected to the redistribution layer of the connection member.

10. The electronic component package of claim 9, wherein the backside metal layer covers the one or more passive components.

11. The electronic component package of claim 9, wherein the core member further includes a third metal layer disposed on a wall surface of the second through-hole, and
    the third metal layer is connected to the first metal layer.

12. The electronic component package of claim 9, wherein the encapsulant includes a first encapsulant filling at least a portion of the second through-hole while covering at least a portion of each of the core member and the one or more passive components, and
    a second encapsulant filling at least a portion of the first through-hole while covering at least a portion of each of the first encapsulant and the inactive surface of the semiconductor chip.

13. The electronic component package of claim 1, further comprising:
    a passivation layer disposed on the connection member, and having an opening exposing at least a portion of the redistribution layer; and
    an electrical connection structure disposed in the opening of the passivation layer, and electrically connected to the redistribution layer exposed by the opening of the passivation layer.

14. The electronic component package of claim 13, further comprising: an underbump metal disposed in the opening of the passivation layer, and electrically connecting the redistribution layer exposed by the opening of the passivation layer to the electrical connection structure.

15. The electronic component package of claim 1, further comprising: a cover layer disposed on the encapsulant, and covering at least a portion of the backside metal layer.

16. An electronic component package, comprising:
a core member including an insulating layer having a through-hole, and a metal layer disposed on an upper surface of the insulating layer and having a groove portion exposing a portion of the upper surface of the insulating layer;
an electronic component disposed in the through-hole;
an encapsulant encapsulating each of the core member and the electronic component, and filling at least a portion of each of the groove portion and the through-hole;
a connection member disposed below the core member and the electronic component, and including a redistribution layer electrically connected to the electronic component;
a backside metal layer disposed on an upper surface of the encapsulant, and covering the electronic component; and
a backside metal via passing through the encapsulant, and connecting the backside metal layer to the upper surface of the insulating layer, exposed through the groove portion.

17. The electronic component package of claim 16, wherein the core member further includes an inner wall metal layer disposed on a wall surface of the through-hole to surround a side surface of the electronic component and connected to the metal layer.

18. The electronic component package of claim 16, wherein the backside metal via is in contact with the upper surface of the insulating layer.

19. The electronic component package of claim 16, wherein the encapsulant fills the groove portion of the metal layer and separates the metal layer from the backside metal via.

20. An electronic component package, comprising:
a core member including an insulating layer, and having a through-hole passing through the insulating layer;
a semiconductor chip disposed in the through-hole, and having an active surface on which a connection pad is disposed and an inactive surface opposing the active surface;
an encapsulant covering at least a portion of each of the core member and the inactive surface of the semiconductor chip, and filling at least a portion of the through-hole;
a connection member disposed on the core member and the active surface of the semiconductor chip, and including a redistribution layer electrically connected to the connection pad;
a backside metal layer disposed on the encapsulant, and covering at least the inactive surface of the semiconductor chip; and
a backside metal via passing through the encapsulant, and connecting the backside metal layer to the insulating layer,
wherein the core member further includes a metal layer disposed on the insulating layer,
the metal layer has a groove portion exposing a portion of the insulating layer, and
the backside metal via passes through the groove portion of the metal layer, is in contact with the insulating layer, and is spaced apart from the metal layer by the encapsulant filling the groove portion.

* * * * *